(12) United States Patent
Seng et al.

(10) Patent No.: US 7,618,884 B2
(45) Date of Patent: Nov. 17, 2009

(54) METHOD AND DEVICE WITH DURABLE CONTACT ON SILICON CARBIDE

(75) Inventors: William F. Seng, Austin, TX (US); Richard L. Woodin, North Yarmouth, ME (US); Carl Anthony Witt, Gorham, ME (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 12/106,646

(22) Filed: Apr. 21, 2008

(65) Prior Publication Data

US 2008/0227275 A1    Sep. 18, 2008

Related U.S. Application Data

(62) Division of application No. 11/083,560, filed on Mar. 18, 2005, now Pat. No. 7,411,218.

(60) Provisional application No. 60/554,676, filed on Mar. 19, 2004.

(51) Int. Cl.
*H01L 29/47* (2006.01)
*H01L 21/44* (2006.01)
*H01L 21/441* (2006.01)

(52) U.S. Cl. .................. 438/571; 438/570; 438/572; 438/581; 438/582; 438/931; 257/77; 257/471; 257/E21.359; 257/E21.368; 257/E21.47

(58) Field of Classification Search .................. 438/570, 438/571, 572, 582; 257/77, 471
See application file for complete search history.

(56) References Cited

U.S. PATENT DOCUMENTS

| 5,399,883 | A | 3/1995 | Baliga |
| 5,925,895 | A | 7/1999 | Sriram et al. |
| 6,229,193 | B1 | 5/2001 | Bandic et al. |
| 6,703,276 | B2 | 3/2004 | Alok et al. |
| 7,262,434 | B2* | 8/2007 | Okamura et al. ............... 257/77 |
| 2001/0019165 | A1* | 9/2001 | Bandic et al. ............... 257/473 |

FOREIGN PATENT DOCUMENTS

| EP | 0518683 A1 | 12/1992 |
| JP | 61059879 A | 3/1986 |

OTHER PUBLICATIONS

First Office Action of China Patent Office (CPO) in corresponding Chinese Patent Application No. 200580008778.6, translation of text into English provided, dated Jun. 27, 2008, pp. 1 through 8.

(Continued)

*Primary Examiner*—Dao H Nguyen
(74) *Attorney, Agent, or Firm*—Thomas R. FitzGerald, Esq.; Hiscock & Barclay, LLP

(57) ABSTRACT

A Schottky barrier silicon carbide device has a Re Schottky metal contact. The Re contact 27 is thicker than 250 Angstroms and may be between 2000 and 4000 Angstroms. A termination structure is provided by ion milling an annular region around the Schottky contact.

23 Claims, 12 Drawing Sheets

OTHER PUBLICATIONS

Kennou S et al.: An Interface Study of Vapor-deposited Rhenium with the Two (0001) Polar Faces of Single Crystal 6H-SiC, Diamond and Related Materials, Elsevier Science Publishers, Amsterdam, NL. vol. 6, No. 10, Aug. 1, 1997, pp. 1424-1427, XP004096956 ISSN: 0925-9635 *the whole document*.

Chen J S et al.: "Stability of Rhenium Thin Films on Single Crystal (001) Beta-SiC", Jan. 15, 1994, Journal of Applied Physics, American Institute of Physics. New York, US, pp. 897-901, XP0000425455 ISSN: 0021-8979 *the whole document*.

Shalish I et al.: "Thermal Stability of Re Schottky Contacts to 6H-SiC", IEEE Electron Device Letters, IEEE Service Center, New York, NY, US, vol. 21, No. 12, Dec. 1, 2000, XP011018880, ISSN: 0741-3106 *the whole document*.

* cited by examiner

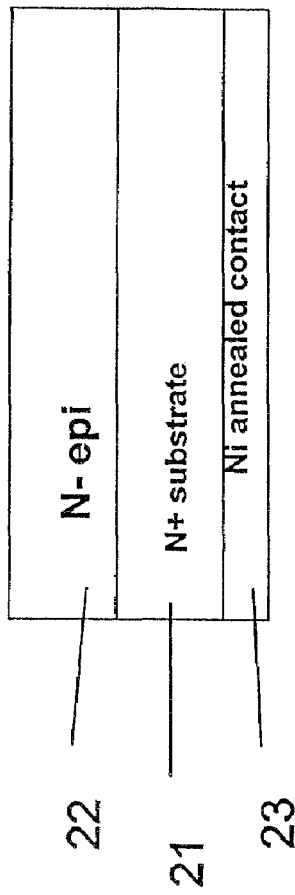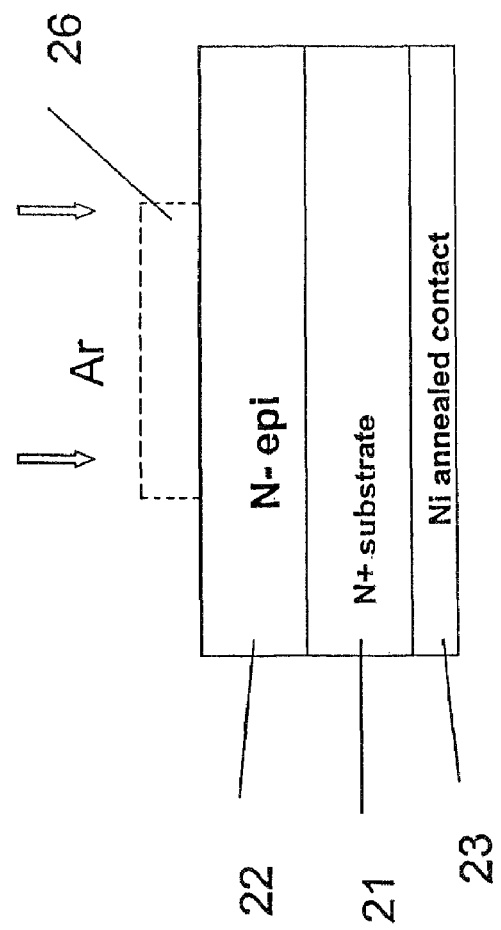

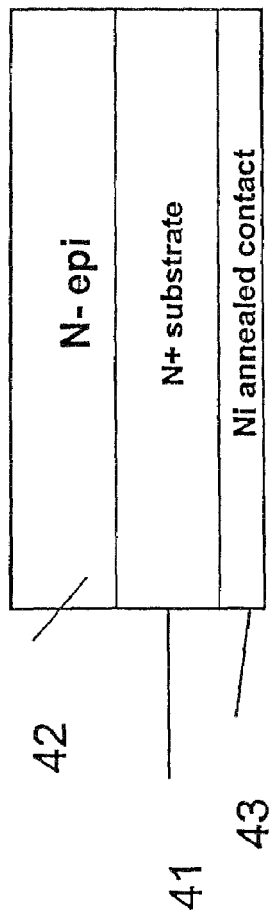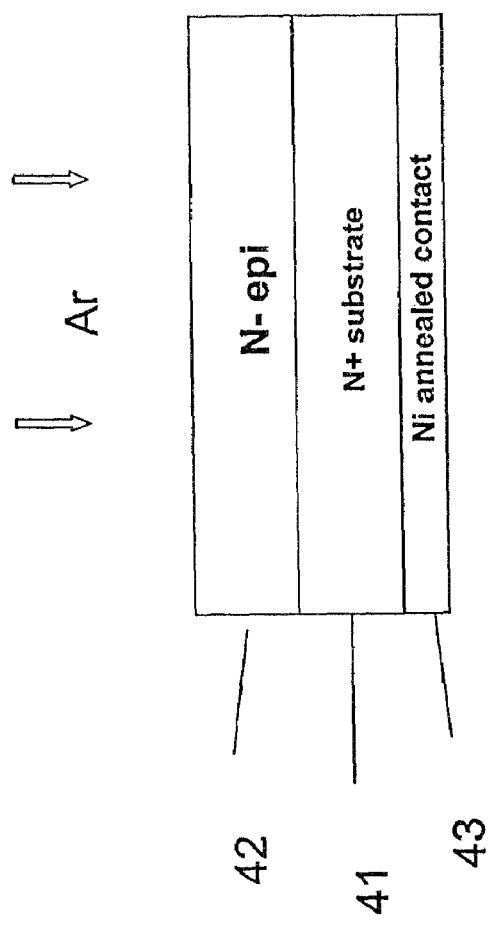

METHOD AND DEVICE WITH DURABLE CONTACT ON SILICON CARBIDE

CROSS-REFERENCE TO RELATED APPLICATIONS

This application is a divisional of U.S. patent application Ser. No. 11/083,560 filed Mar. 18, 2008 which claims the benefit of the priority date of U.S. Provisional patent application Ser. No. 60/554,676 filed Mar. 19, 2004, which is incorporated by reference in its entirety.

BACKGROUND

The present invention relates to methods of making semiconductor devices and in particular to methods of providing Schottky contacts to compound semiconductor layers utilized in semiconductor devices.

The fabrication and operation of diodes (junction and Schottky) and basic transistor devices are well known. New technologies have developed needs for higher speed and power transistors capable of withstanding extreme operating conditions such as high temperatures, current, and radiation. Silicon carbide devices have the potential to fulfill these needs but have yet to achieve commercial success. One obstacle to using silicon carbide in electronic devices is the difficulty in providing reliable and durable electrical contacts to the device.

Whenever a metal and a semiconductor are in intimate contact, there exists a potential barrier between the two that prevents most charge carriers (electrons or holes) from passing from one to the other. Only a small number of carriers have enough energy to get over the barrier and cross to the other material. When a bias is applied to the junction, it can have one of two effects: it can make the barrier appear lower from the semiconductor side, or it can make it appear higher. The bias does not change the barrier height from the metal side. The result of this is a Schottky Barrier (rectifying contact), where the junction conducts for one bias polarity, but not the other. Almost all metal-semiconductor junctions will exhibit some of this rectifying behavior.

Schottky barrier diodes (SBD's) in Si are only practical to around 70V-100V, limited by excess leakage under reverse bias. Using SiC allows use of SBD's at much higher voltages, up to 1200V. Diodes are used as high-voltage rectifiers in many power switching applications. Whenever current is switched to an inductive load such as an electric motor, high-voltage transients are induced on the lines. To suppress these transients, diodes are placed across each switching transistor to clamp the voltage excursions. PN junction diodes can be used for this application, but they store minority carriers when forward biased, and extraction of these carriers allows a large transient reverse current during switching. Schottky barrier diodes are rectifying metal-semiconductor junctions, and their forward current consists of majority carriers injected from the semiconductor into the metal. Consequently, SBD's do not store minority carriers when forward biased, and the reverse current transient is negligible. This means the SBD can be turned off faster than a PN diode, and dissipates negligible power during switching. SiC Schottky barrier diodes are especially attractive because the breakdown field of SiC is about eight times higher than in silicon, enabling much higher voltage operation compared to Si. SiC Schottky barrier diodes can be used in place of Si PN diodes, enabling faster switching speeds and greater efficiency. In addition, because of the wide bandgap, SiC SBD's should be capable of much higher temperature operation than silicon devices.

However, conventional SiC Schottky barrier diodes experience problems. Many conventional SiC Schottky diodes use nickel (Ni) as a metal for the Schottky contact.

The Ni is typically annealed on the backside to provide an ohmic contact and left unannealed on the front side to provide the Schottky contact. Ni is reactive with SiC and even at low temperatures the reaction proceeds until the Ni Schottky contact becomes ohmic. At high current densities, the Ni-SiC diodes become hot and, over time, tend to anneal the Schottky contact. Given temperature variations and time and the current carried by the Ni-SiC diodes, it is virtually inevitable that they will degrade and become resistors. This can have catastrophic consequences for the electronic device or system that is relying upon the Ni-SiC Schottky diode to conduct or block current.

The ternary phase diagram was calculated for the system composed of rhenium, silicon and carbon. The ternary diagram is calculated assuming constant temperature, pressure, and the neglect of ternary compounds of Re, Si, and C. To calculate the ternary phase diagram, the Gibbs Phase rule is employed, which demands that at constant temperature and pressure only three phases are allowed simultaneously. This is discussed in References 1 and 2. In a practical sense this means that tie lines—lines which connect compounds and elements that are thermodynamically stable with each other and do not react—are not allowed to cross in the diagram, because at that point 4 phases would be allowed to exist, which is forbidden by Gibbs' Phase Rule. These tie lines are calculated by considering the Gibbs Free Energy of all of the possible reactions of the constituent compounds and elements of the system (in this case, Re, Si, C, and the Re suicides). Based on the Gibbs Free Energy, if none of the reactions proceed for any given pair of reactants, the pair is connected by a tie line. This procedure is repeated until all possible pairs of reactants have been considered. The resulting ternary phase diagram is shown in FIG. 6. Thermodynamic data for the calculation is taken from Reference 3.

The ternary phase diagram in FIG. 6 makes quite clear that Re is thermodynamically stable with respect to SiC over the temperature range from 300 to 1100 K. This means that a film of Re will not react with SiC to form Re silicides over this temperature range. No Re carbides are stable in the temperature range of 300 to 1100 K. An example of the stability of Re on SiC has been discussed in Reference 4. Reference 4 shows Re stable on beta-SiC at 1100 ° C.

As to first order the electrical properties of a system are governed by physical properties, the fact that the Re will not react with SiC means that because the Re contact is a Schottky barrier, it will remain a Schottky barrier. When, but not until, the Re-SiC system temperature increases to over 1100K, the Re reacts to form a Re-silicide, and the electrical properties may change. The Re/SiC ternary phase diagram makes quite clear the long lifetime and durability of the Re-SiC contact, useful for devices from diodes to MESFETs.

SUMMARY

The invention solves the problem of degrading Schottky contacts by providing a durable, rugged and longer lived SiC Schottky barrier diode or MESFET. Some Schottky materials degrade over time and become ohmic contacts, thereby defeating their purpose. However, the invention provides a Rhenium (Re) metal Schottky contact. Re is more durable than other Schottky materials, such as Ni. Re will retain its Schottky characteristics over a long period of time. It can withstand more operations and higher temperatures than other materials before becoming ohmic. Re thus increases the lifetime of the device, provides higher current densities than other Schottky metal contacts, and has improved performance at higher current densities and higher operating temperatures.

Field termination is also an important feature of a high voltage rectifying contact. During reverse voltage conditions the electric field lines in the region of the edges and corners of any contact will tend to increase in density and become crowded together. This crowding will increase the local electric field to very high levels. Such local field levels may exceed the breakdown voltage of the drift layer under the contact even though the average field intensity is low enough for the rest of the drift layer. When that occurs, the local high field area may breakdown and start conducting reverse current. A local breakdown spreads rapidly to adjacent areas and the device rapidly breaks down entirely. As such, it is desirable to provide a field termination structure around contacts that are subject to reverse breakdown.

The invention also provides two methods for providing and improving field termination at the Schottky contact. One method uses patterned ion milling and the other method uses blanket ion milling.

DRAWINGS

The present invention is illustrated by way of example and not limitation in the accompanying figures.

FIGS. 2a-2f are sequential steps for making the diode of FIG. 1 with patterned ion milling for termination improvement.

FIGS. 3a-3f are sequential steps for making an alternate diode with blanket ion milling for termination improvement.

Skilled artisans appreciate that elements in the figures are illustrated for simplicity and clarity and have not necessarily been drawn to scale. For example, the dimensions of some of the elements in the figures may be exaggerated relation to other elements to help to improve understanding of embodiments of the present invention.

DETAILED DESCRIPTION

Reference is now made in detail to the exemplary embodiments of the invention, examples of which are illustrated in the accompanying drawings. Wherever possible, the same reference numbers will be used throughout the drawings to refer to the same or like parts (elements).

Described generally below is a process for fabricating an electrical connection between a metal contact and a thin layer of silicon carbide. The contact process is described in the context of fabricating a planar, multi-layered silicon carbide device, but as one skilled in the art may surmise, it may be used for forming connections between any applicable metal and silicon carbide layer.

Figure 1:
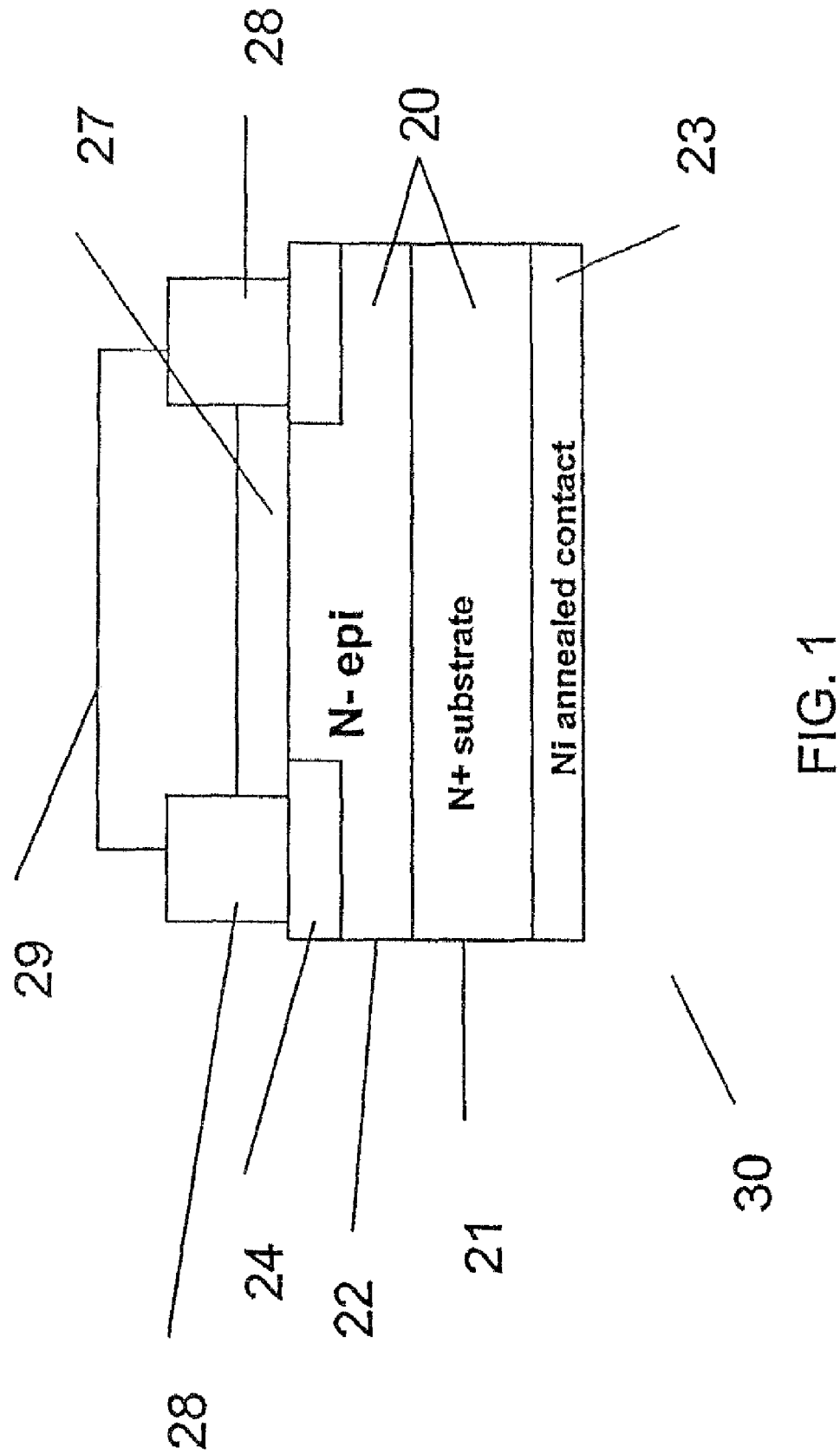
FIG. 1 is a cross section view of a multi-cell Schottky diode.

An example of the inventive Re-SiC Schottky barrier diode is shown in FIG. 1. There a diode 30 constructed in a die of SiC semiconductor material. The diode 30 has a lower or back surface ohmic contact 23 of annealed nickel (Ni) deposited on a highly n-doped substrate 21. The ohmic contact 23 forms the cathode of the diode 30. A lightly doped epitaxial layer 22 of n-doped SiC is on the substrate 21. The epitaxial layer 22 provides the drift region for the diode 30. Regions 24 at the surface of the epitaxial layer are ion milled. As a result, the crystal structure of the SiC in regions 24 is damaged and not as ordered as the crystal structure in adjacent, undamaged regions, such as the region below the central portion of the Schottky metal contact 27. That contact in the preferred embodiment is rhenium (Re) and forms the anode of the Schottky diode. Passivation material 28 surrounds the Re contact 27 and covers the ion milled surface 24 of the layer 22. Vias in material 28 are filled with top level metal, such as aluminum (Al) 29, for making contact to other devices or systems.

The SiC Schottky diode of FIG. 1 is made in accordance with the sequence of steps shown in FIGS. 2a-2d. First a wafer of SiC is either grown or highly doped with n-type dopants to provide substrate 21. The substrate 21 may include silicon carbide, gallium nitride, aluminum nitride, or other wide band gap semiconductors. A wide band gap material will have a band gap of about 3 eV or greater. Next a low doped n-type drift layer 22 of SiC is epitaxially grown, preferably by chemical vapor deposition, on top of substrate 21 to provide the multilayer substrate 20. Layer 21 can have a thickness in a range of approximately 2-20 microns. See FIG. 2a. Any suitable donor, such as nitrogen and phosphorous, may be used to obtain the doping of these layers. Typical doping concentrations may be 1E13-1E17 $cm^{-3}$ and 1E18-1E20 $cm^{-3}$ for the drift layer 22 and the substrate layer 21, respectively. An ohmic metal contact 23 is formed on the lower or back surface of the multilayer substrate 20. The ohmic contact metal is typically Ni that is deposited by sputtering and then annealed at about 800 degrees C for 30 minutes to provide ohmic contact to the highly n-doped substrate 21. The annealing process normally takes place before ion milling because annealing tends to repair damage due to ion milling and the invention requires that the ion milled damage remain in the epitaxial layer 22. It is efficient to perform the high temperature annealing process before ion milling.

Next an ion mill mask 26 is deposited. The ion mill mask is typically photoresist or other suitable material. The ion mill mask is patterned to expose regions around the future Schottky contact area 26 which is protected from ion milling. The substrate is transferred to a suitable ion milling apparatus where the area 24 surrounding the future Schottky contact area 26 is ion milled.

Figure 4:
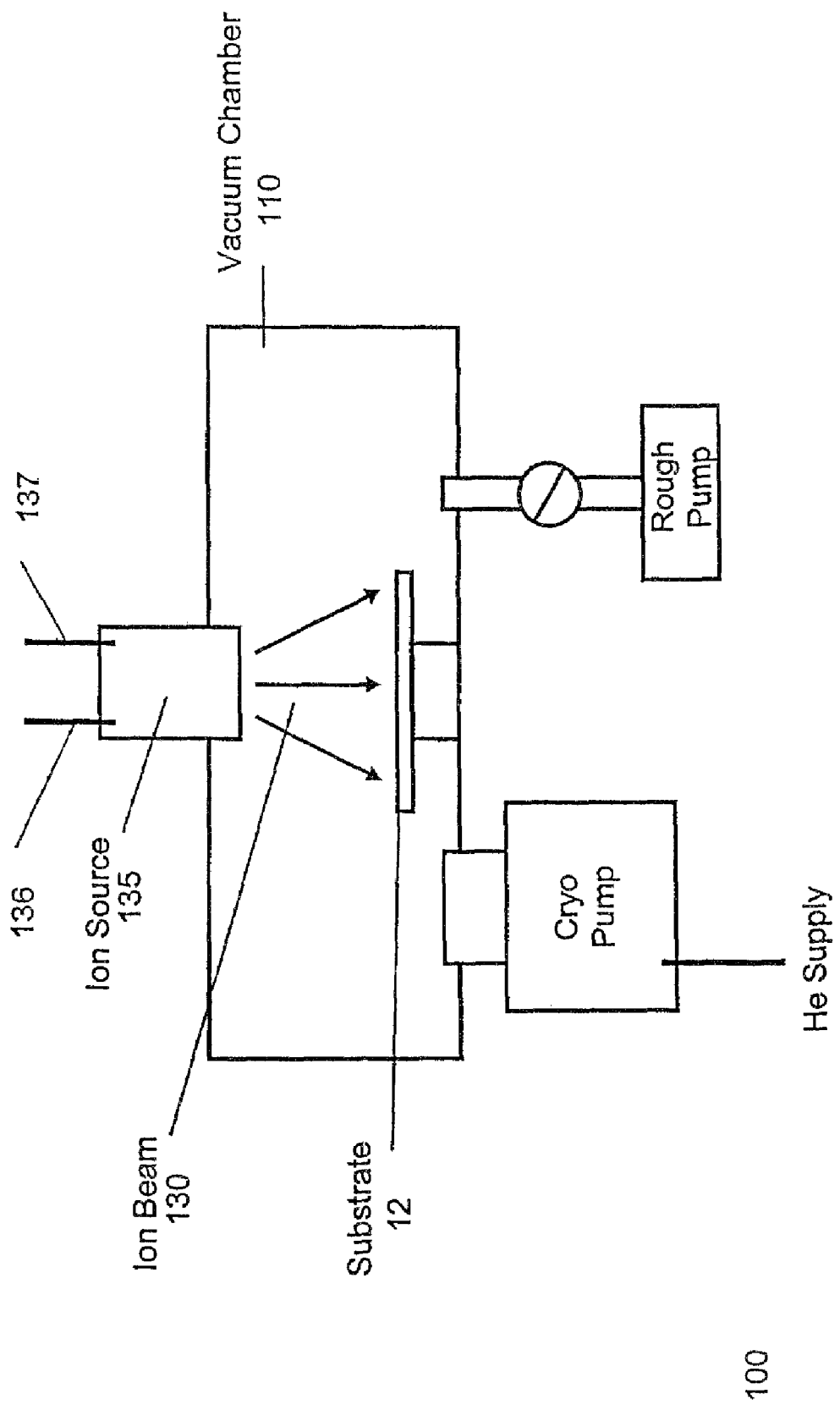
FIG. 4 is an ion milling apparatus for ion milling the surface of the substrate before depositing the contact layer.

The ion milling operation is performed in an ion milling apparatus 100 as shown in FIG. 4. It has a chamber 110 that is equipped with an ion beam source 135. The source 135 generates an ion beam 130 that is directed at the surface of substrate 12. Ion beam source 135 is preferably a high current source with a beam current between 10 and 500 milliamps, and an adjustable energy within the range from about 10 to about 2,000 electron volts (eV). Moreover, source 135 preferably has a spot size (beam diameter) within the range from about 3 to about 12 centimeters, depending upon the nature of the substrate to which the beam must be applied. A preferred ion beam source 135 is commercially available from Commonwealth Scientific of Fremont, Calif. The term "ion milling" is used broadly to include all energetic particles which may be generated from the ion beam source and strike the substrate, including both ions and neutralized particles.

In order to operate the ion beam source 135, there must be a gas supply subsystem (not shown) of the ion beam gas 136, and an ion source power supply subsystem (not shown) 137.

Certain other gases may be supplied from individual subsystems for a variety of purposes. For example, gases may be introduced into the vacuum chamber 110 for purposes of chamber cleaning, purging, chemical etching, and other purposes. Ion beam milling can use reactive or non-reactive (noble) gasses or mixtures of these. He, Ar, Kr, and/or Xe can be accelerated towards the substrate to induce physical sputter-etching (molecular sandblasting), to act as the pressure equivalent in CMP. The kinetic energy of the impinging species can be adjusted in 2 ways. Kinetic energy is proportional to the mass of the impinging species. In addition, kinetic energy is also proportional to the acceleration voltage squared. This roughly correlates with material removal rates, however, too much voltage (>1 KeV) may result in substrate damage. In this application, the accelerating voltage regulates the velocity of the incoming ionized noble gasses. Other gasses can be used to add a chemical component to the reaction. These include, for example, $NF_3$, oxygen, and Freons such as $C_2F_6$ and $CF_4$ which can be used independently or mixed to adjust the chemical component of the milling.

Figure 2C:
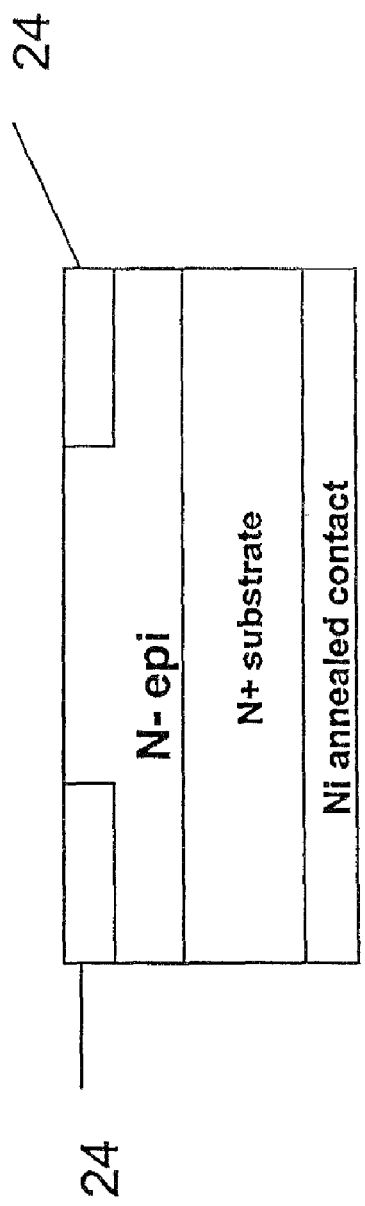
Figure 2D:
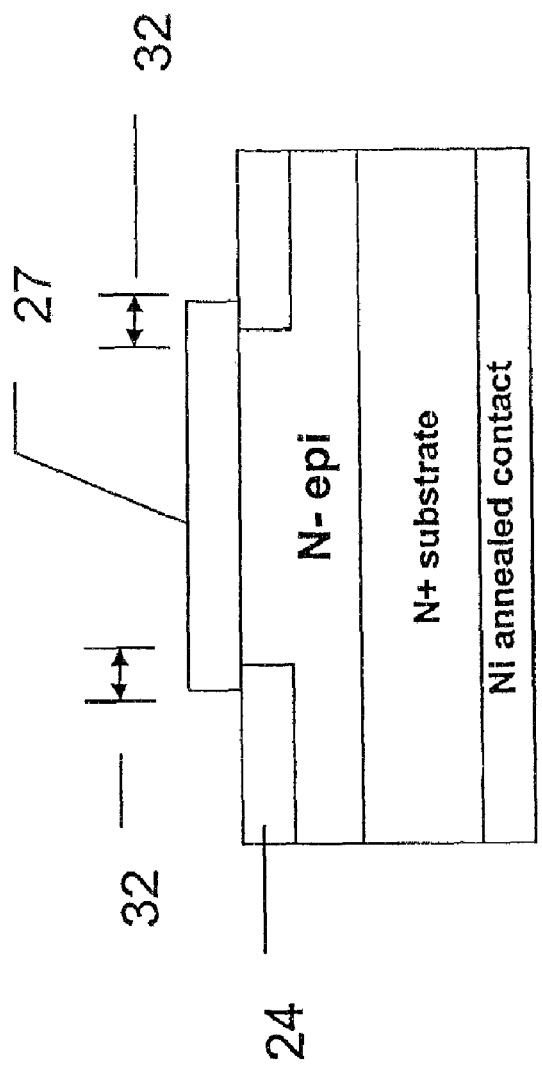

After ion milling, the substrate 20 is further processed as shown in FIGS. 2c, 2d to receive a Re Schottky contact. The ion mill mask is stripped and a layer of Re 27 is deposited on the surface of epitaxial layer 22. The Re layer 27 is deposited by any of a number of methods, including DC sputtering, RF sputtering, thermal evaporation, e-beam evaporation and chemical vapor deposition. The Re layer 27 is typically between 2000 and 4000 Angstroms thick but may be a thin as 250 Angstroms. Such layers may carry current densities on the order of 4000 amps/cm.sup.2. In theory the layer of Re may be even thinner, but its thickness is limited by the roughness surface 24. Even if the surface 24 was perfectly smooth at the start of a process, it is very difficult to avoid surface damage. Any damage to the surface will provide spiking of surface material that can be higher than the thin layer of Re and thus will spike through the layer of Re. The Re layer 27 is patterned to form the Schottky contacts. A suitable mask, such as photoresist, is deposited over the Re layer 27 and is patterned to expose portions of the layer 27 that will be removed. The patterning operation leaves an overlap 32 of the outside edge of the remaining Re 27 over the inside edges of the ion milled areas 24. The exposed Re areas are typically removed with a wet etch followed by stripping the photoresist mask.

Figure 2E:
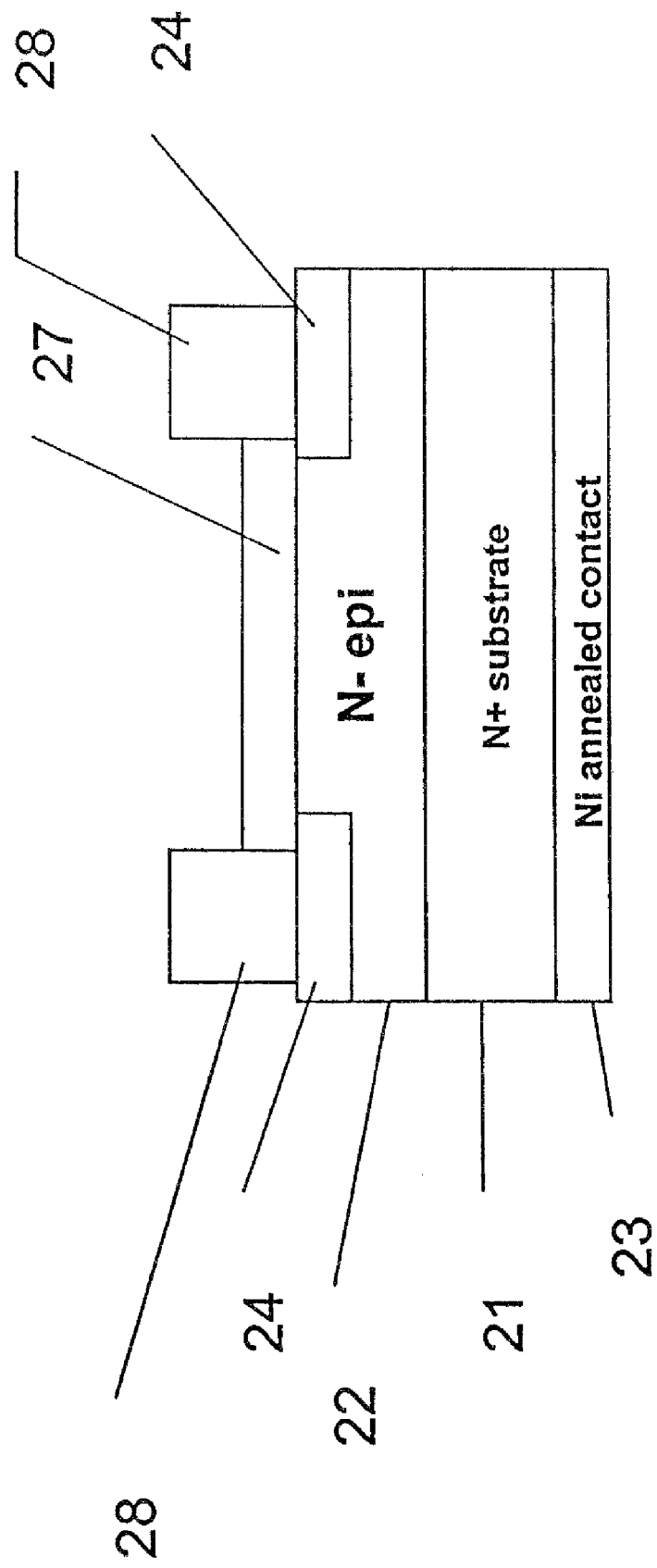
Figure 2F:
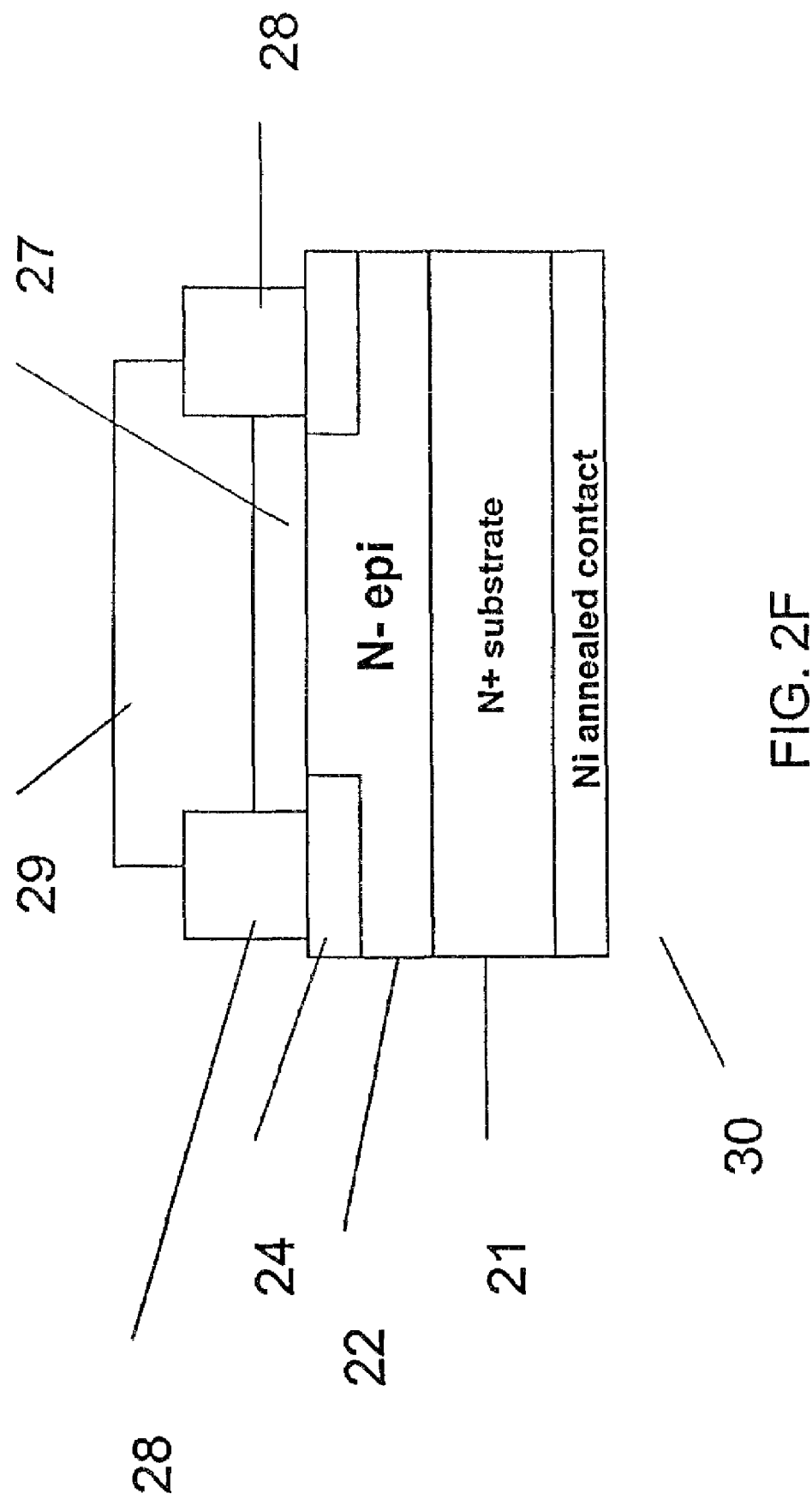

As shown in FIG. 2e, the surface is covered with a passivation layer 28, typically a deposited insulating material such as silicon dioxide. The passivation layer 28 is patterned with photoresist to provide vias for contact metal layers and for identifying the sawing streets in the wafer. Passivation material 28 remains over the ion milled areas 24 and abuts and may overlap the outer edges of the Re Schottky contacts 27. In a final step (FIG. 2f) a layer 29 of aluminum (Al) or other suitable upper level metal is deposited in the vias of the passivation layer 28 to make contact to the Re Schottky metal on the epitaxial layer 22.

Ion milling may be used in a different way to achieve field termination. An alternative set of steps is shown in FIGS. 3a-3f. In that process the entire surface of the epitaxial layer is ion milled to provide a slightly damaged crystalline surface. Then the Re layer is deposited and patterned.

First a wafer of SiC is either grown or highly doped with n-type dopants to provide substrate 41. The substrate 41 may include silicon carbide, gallium nitride, aluminum nitride, or other wide band gap semiconductors. A wide band gap material will have a band gap of about 3 eV or greater. Next a low doped n-type drift layer 42 of SiC is epitaxially grown, preferably by chemical vapor deposition, on top of substrate 41 to provide the multilayer substrate 20. Layer 41 can have a thickness in a range of approximately 2-20 microns. See FIG. 3a. Any suitable donor, such as nitrogen and phosphorous, may be used to obtain the doping of these layers. Typical doping concentrations may be 1E13-1E17 $cm^{-3}$ and 1E18-1E20 $cm^{-3}$ for the drift layer 42 and the substrate layer 41, respectively. An ohmic metal contact 43 is formed on the lower or back surface of the multilayer substrate 20. The ohmic contact metal 43 is typically Ni that is deposited by sputtering and then annealed at about 800° C. for 30 minutes to provide ohmic contact to the highly n-doped substrate 41. The annealing process normally takes place before ion milling because annealing tends to repair damage due to ion milling and the invention requires that the ion milled damage remain in the epitaxial layer 42. It is efficient to perform the high temperature annealing process before ion milling.

Next the entire surface is ion milled. Unlike the process step shown in FIG. 2c, the step shown in FIG. 3c has no ion mill mask. This features reduces the number of steps in the process and still provides field termination for the Schottky contact 47. The substrate is transferred to a suitable ion milling apparatus 100 where the surface of epitaxial layer 42 is ion milled with Ar or another noble gas.

Figure 3C:
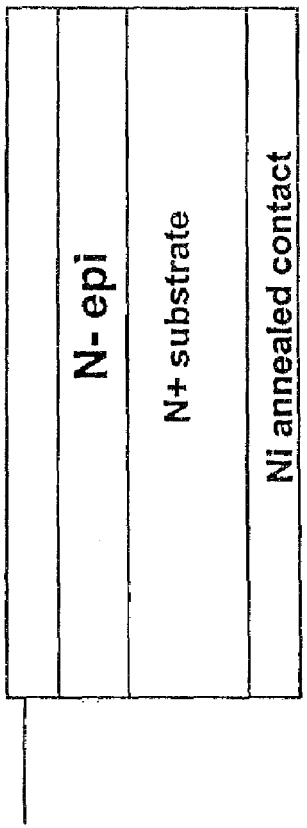
Figure 3D:
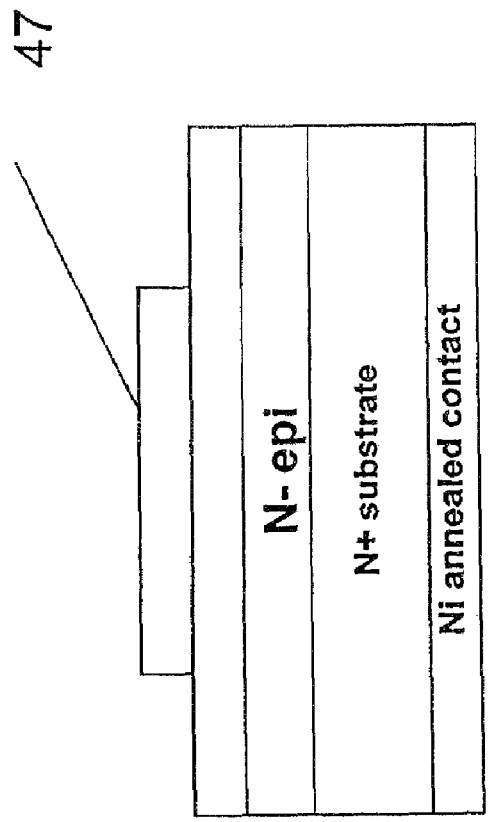

After ion milling, the substrate is further processed as shown in FIGS. 3c, 3d to receive a Re Schottky contact. A layer of Re 47 is deposited on surface of epitaxial layer 42. The Re layer 47 is deposited by any of a number of methods, including DC sputtering, RF sputtering, thermal evaporation, e-beam evaporation and chemical vapor deposition. The Re layer 47 is typically between 2000 and 4000 Angstroms thick but may be as thin as 250 Angstroms. Such layers may carry current densities on the order of 4000 amps/cm.sup.2. In theory the layer of Re may be even thinner, but it thinness is limited by the roughness of surface 44. Even if the surface 44 was perfectly smooth at the start of a process, it is very difficult to avoid surface damage. The ion milling damage to the surface may provide spiking of surface material that can be higher than the thin layer of Re and thus will spike through the layer of Re. As such, the Re layer 47 is made thick enough to cover the spikes on the surface 44. The Re layer 47 is patterned to form the Schottky contacts. A suitable mask, such as photoresist, is deposited over the Re layer 47 and is patterned to expose portions of the layer 47 that will be removed. The exposed Re areas are typically removed with a wet etch followed by stripping the photoresist mask.

Figure 3E:
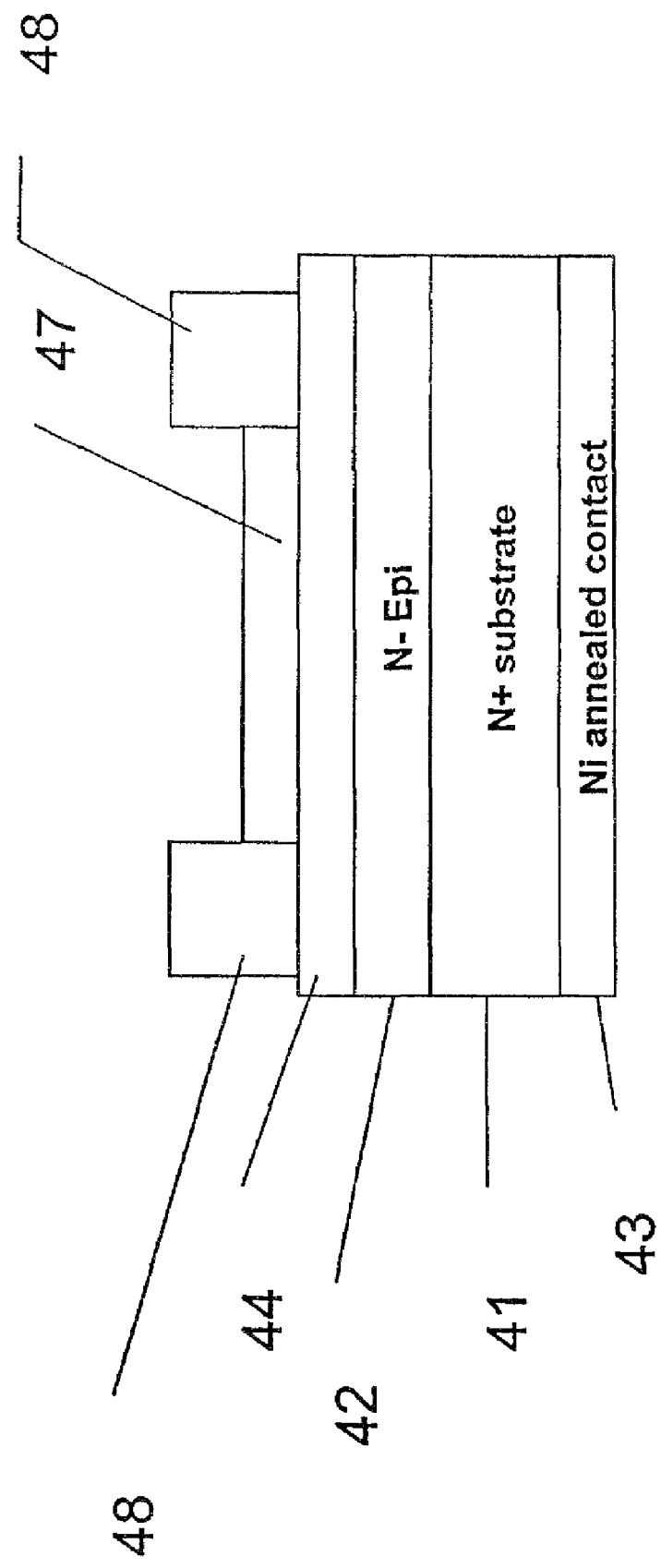
Figure 3F:
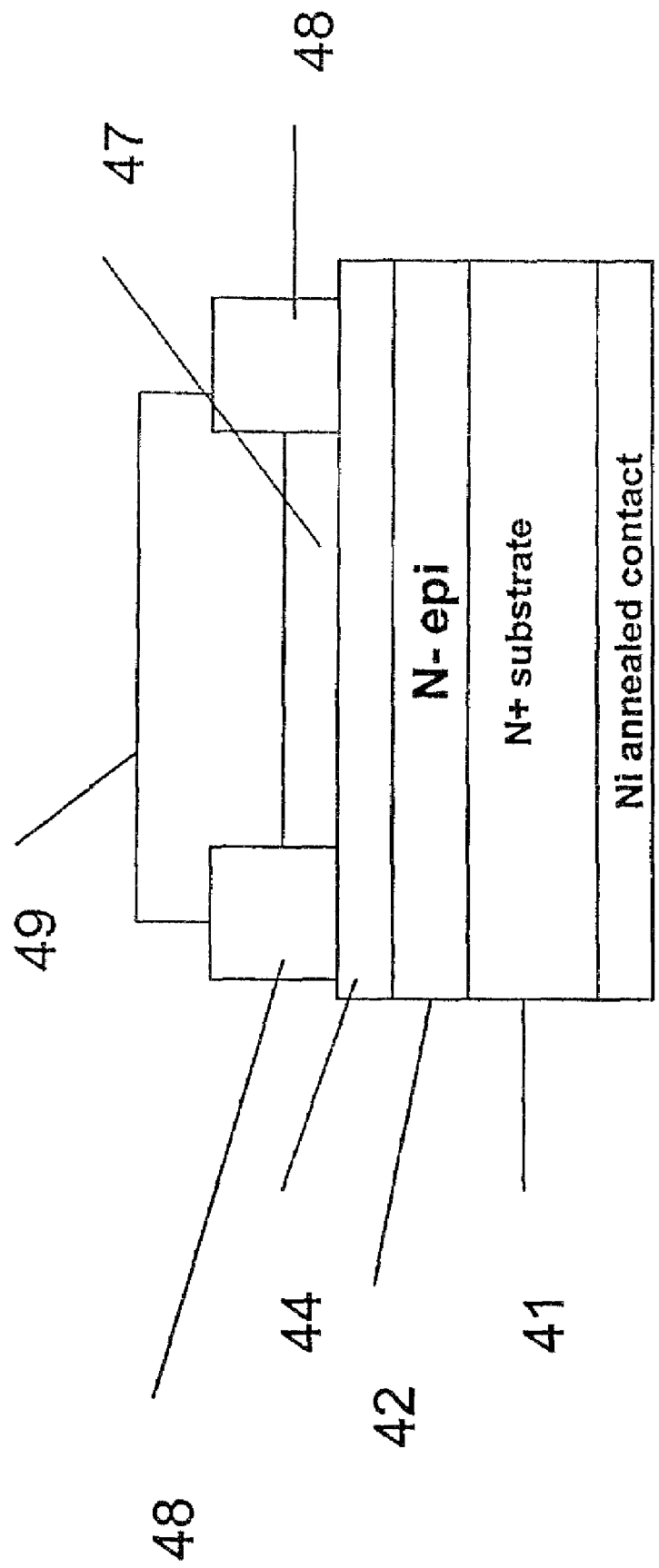

As shown in FIG. 3e, the surface is covered with a passivation layer 48, typically a deposited insulating material such as silicon dioxide. The passivation layer 48 is pattered with photoresist to provide vias for contact metal layers and for identifying the sawing streets in the wafer. Passivation material 48 remains over the portions surface 44 and abuts and may overlap the outer edges of the Re Schottky contacts 47. In a final step (FIG. 3f) a layer of aluminum (Al) 49 or other suitable upper level metal is deposited in the vias of the passivation layer 48 to make contact to the Re Schottky metal on the epitaxial layer 42.

The Re contact 47 on the damaged surface of epitaxial layer 42 has more forward voltage drop ($V_F$) than a Re contact 27 on the undamaged surface of its epitaxial layer 22. However, the reverse or blocking voltage characteristic of the diode may be substantially improved. Of course, there is a performance tradeoff between increased $V_F$ and reverse blocking capability. The desired amount of ion milling is a function of the conductivity of the drift layer 22 and is likely best determined by routine experimentation.

In the Schottky diode 30, 49 the drift layer 22, 42 doping density determines the breakdown voltage and the drift layer thickness is chosen so that depletion layer punch-through occurs at the same voltage as avalanche breakdown. As reverse voltage increases, the field line at the edges and corners of the Re Schottky contact 27, 47 become crowded together. The damaged surface areas 24, 44 below and/or around the Re Schottky contact(s) 27, 47 reduce the crowding of the field lines and thereby raise the breakdown voltage.

Those skilled in the art understand that the ion milling feature of the invention may be used with any other suitable Schottky metal contact, such as Ti, W or alloys such as TiW. In the foregoing specification, the invention has been described with reference to specific embodiments. Those skilled in the art also understand that the Schottky contact may be formed before the surface of the lightly doped layer is ion milled. The Schottky contact will act as a mask for ion milling and the ion milled area will be self aligned to the Schottky contact.

The examples described above used SiC and one or a number of possible compound semiconductor material with large band gaps. A compound semiconductor includes at least two dissimilar elements that form a semiconductor material. In one specific example, at least two dissimilar Group IVA elements such as carbon, silicon, or germanium can be part of the semiconductor material. Silicon carbide (SiC) is an example of a compound semiconductor material having Group IVA elements. In this particular embodiment, regions 21 and 22 may comprise SiC. SiC polytype 4H may be used as well as 6H, 3C, or other polytypes with semiconductor properties.

Figure 5:
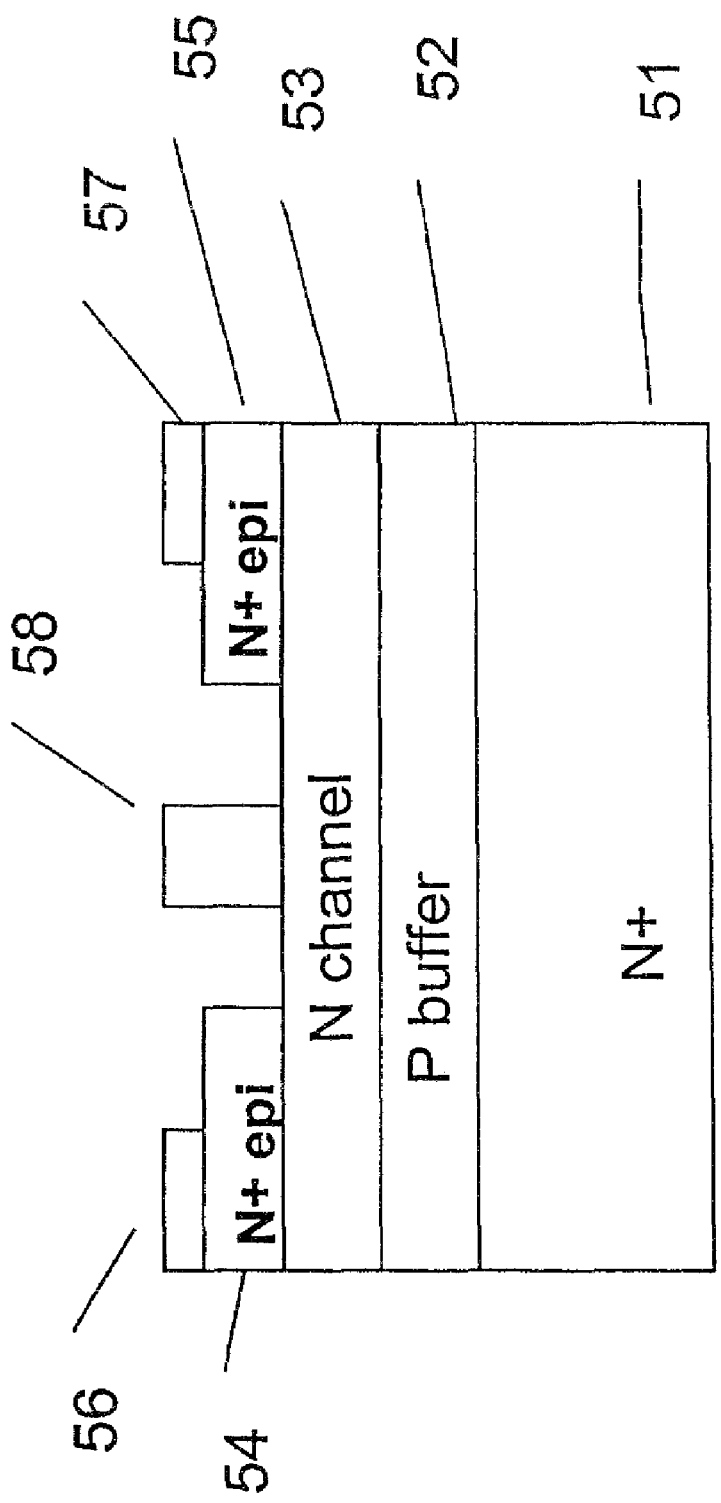
FIG. 5 is a cross section diagram of a MESFET with the Re contact of the invention.
Figure 6:
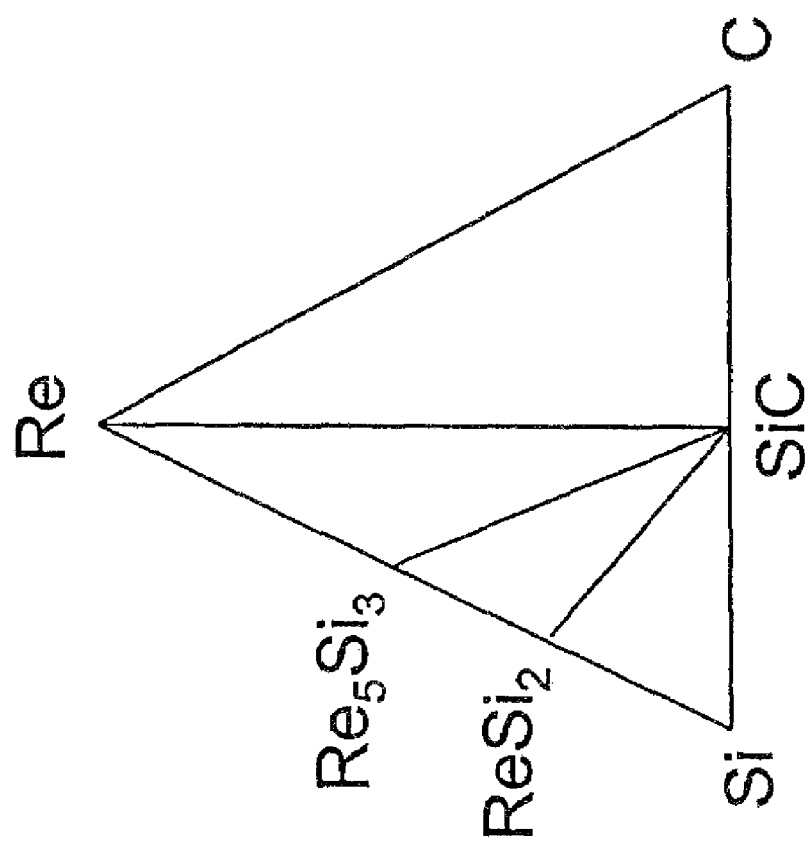
FIG. 6 is a ternary phase diagram for the Re/SiC material system.

The Re contact described above may also be used in a metal-semiconductor field effect transistor (MESFET) 50 such as shown in FIG. 5. Unlike the Schottky diode, the MESFET is a lateral device with source and drain contacts on the top surface. The n-type substrate 51 has a lightly doped p-buffer layer 52 on top. The buffer layer provides device isolation so that the MESFET may be incorporated into a substrate with other devices. Majority carriers flow in the lightly doped n-channel, typically $1E17\ cm^{-3}$, from source to drain and are controlled by a Schottky gate contact 58. A lightly doped n-channel layer covers the p-buffer layer. The surface comprises a highly doped n-epitaxial layer that is patterned into sources 54 and drains 55 with ohmic contacts 56, 57, respectively. A Re Schottky contact 58 is disposed on the surface of the channel layer 53 between the source and the drain 54, 55. The Re Schottky contact 58 is controlled by a suitable voltage. It modifies the depletion region in the channel and thereby controls the flow of charges in the channel layer 53 between the source 54 and drain 55. The Re layer is at least 250 Angstroms thick and is preferably between 2,000 and 4,000 Angstroms.

The following examples are illustrative of the devices and process described above.

EXAMPLE 1

Schottky diodes without field termination were fabricated on highly n-doped SiC substrate EE 15 with a 16 μm SiC epitaxial layer lightly n-doped at a concentration of $1.1E16\ cm^{-3}$. An ohmic contact was created on the highly doped side of the substrate by depositing a 2500 Å layer of Ni and annealing in vacuum. A 500 Å layer of Re was deposited on the epilayer by electron beam evaporation. The Re layer was patterned and etched to create anode contacts that are $1.77E-4\ cm^2$. The current vs. voltage characteristics of the resulting diodes were measured using a Tektronix model 577 curve tracer. The diodes were observed to sustain operation at 0.7 A of forward current, which is $4000\ Acm^{-2}$.

EXAMPLE 2

Schottky diodes without field termination were fabricated on highly n-doped SiC substrate GB9 with a 4.8 μm SiC epitaxial layer lightly n-doped at a concentration of $9.3E15\ cm^{-3}$. An ohmic contact was created on the highly doped side of the substrate by depositing a 2500 Å layer of Ni and annealing in vacuum. A 2500 Å layer of Re was deposited on the epilayer by rf magnetron sputtering. The Re layer was patterned and etched to create anode contacts that have an area of $2.475E-4\ cm^2$. The resulting diodes were reverse biased and the current vs. voltage characteristics measured.

Hatakayama (References 5, 6) teaches that SiC Schottky diodes will have reverse leakage current due to tunneling that depends exponentially on the electric field at the metal-semiconductor junction. The leakage current often limits device performance before avalanche breakdown, and $4\ mAcm^{-2}$ is a typical maximum reverse leakage current density rating for a high voltage diode. For the diodes in this example, the resulting reverse bias voltage $V_R$ at a reverse leakage current density of $4\ mAcm^{-2}$ was 444±72 V.

EXAMPLE 3

Schottky diodes with blanket field termination were fabricated on three highly n-doped SiC substrates with 5 μm SiC epitaxial layers lightly n-doped at a concentration of $1E16\ cm^{-3}$. Ohmic contacts were created on the highly doped side of each substrate by depositing a 2500 Å layer of Ni and annealing in vacuum. Field terminations were created by ion milling the entire surface of each wafer with a beam of $Ar^+$ ions, each wafer exposed to an $Ar^+$ ion beam of different energy ranging from 250 eV to 500 eV. A 2500 Å layer of Re was deposited on the ion milled surface of each wafer by rf magnetron sputtering. The Re layers were patterned and etched to create anode contacts with an area of $4.9E-3\ cm^2$. The current vs. voltage (IV) characteristics of the resulting diodes were measured.

The diodes are rectifying. The measured diode barrier height extracted from the IV data are tabulated in Table 1. The resulting reverse bias voltages $V_R$ at a reverse leakage current density $J_R$ of $4\ mAcm^{-2}$ are also tabulated in Table 1. At the $V_R$ tabulated in Table 1 the diodes have not been driven into avalanche breakdown. It is seen in Table 1 that the blanket ion milled diodes are terminated because the diodes do not reach $4\ mAcm^{-2}$ until over 550 V, compared to the 444 V measured for unterminated diodes in Example 2.

TABLE 1

Reverse voltage capability of Re Schottky diodes fabricated on 4H—SiC with blanket ion milling termination. The ion species is $Ar^+$. The ion beam current is 150 mA.

| Wafer No. | Ion Energy (eV) | Barrier (eV) | $V_R @ J_R = 4\ mAcm^{-2}$ |
|---|---|---|---|
| GB11 | 250 | 1.2 | 554 ± 11 |
| GB6 | 350 | 1.2 | 602 ± 43 |
| GB10 | 500 | 1.2 | 554 ± 11 |

EXAMPLE 4

Schottky diodes with self-aligned ion milled field termination were fabricated on a highly n-doped SiC substrate EZ6 with 5 μm SiC epitaxial layer lightly n-doped at a concentration of $1E16\ cm^{-3}$. An ohmic contact were created on the highly doped side of the substrate by depositing a 2500 Å layer of Ni and annealing in vacuum. A 2500 Å layer of Re was deposited on the ion milled surface of the wafer by rf magnetron sputtering. The Re layer was patterned and etched to create anode contacts that are 4.9E-3 cm². Self-aligned field terminations were created by ion milling the entire surface of the wafer with a beam of Ar⁺ ions accelerated to an energy of 750 eV. The current vs. voltage (IV) characteristics of the resulting diodes were measured. The self-aligned ion milled diodes are terminated because the diodes do not reach 4 mAcm⁻² until over 530±25 V, compared to the 444 V reverse voltage measured for unterminated diodes in Example 2.

EXAMPLE 5

Schottky diodes without field termination were fabricated on highly n-doped SiC substrate FH31 with a 5 μm SiC epitaxial layer lightly n-doped at a concentration of 8E15 cm⁻³. An ohmic contact was created on the highly doped side of the substrate by depositing a 2500 Å layer of Ni and annealing in vacuum. A 2500 Å layer of Ti was deposited on the epilayer by electron beam evaporation. The Ti layer was patterned and etched to create anode contacts that are 0.012 cm². The resulting diodes were reverse biased and the current vs. voltage characteristics measured.

As discussed in Example 2, 4 mAcm⁻² is a typical maximum reverse leakage current density rating for a high voltage diode. For the diodes in this example, the resulting reverse bias voltage $V_R$ at a reverse leakage current density of 4 mAcm⁻² was 213±50 V.

EXAMPLE 6

Schottky diodes with blanket field termination were fabricated on four highly n-doped SiC substrates with 5 μm SiC epitaxial layers lightly n-doped at a concentration of 1E16 cm⁻³. Ohmic contacts were created on the highly doped side of each substrate by depositing a 2500 Å layer of Ni and annealing in vacuum. Field terminations were created by ion milling the entire surface of each wafer with a beam of Ar⁺ ions, each wafer exposed to an Ar⁺ ion beam of different energy ranging from 225 eV to 750 eV. A 2500 Å layer of Ti was deposited on the ion milled surface of each wafer by electron beam evaporation. The Ti layers were patterned and etched to create anode contacts that are 4.9E-3 cm². The current vs. voltage (IV) characteristics of the resulting diodes were measured.

The diodes are rectifying. The measured diode barrier height extracted from the IV data are tabulated in Table 2. The resulting reverse bias voltage $V_R$ at a reverse leakage current density of 4 mAcm⁻² are also tabulated in Table 2. At the $V_R$ tabulated in Table 2 the diodes have not been driven into avalanche breakdown.

As discussed in Example 2, the leakage current limits device performance before avalanche breakdown. It is seen in Table 2 that the blanket ion milled diodes are terminated because the diodes do not reach 4 mAcm⁻² until over 525 V, compared to 213 V measured for the unterminated diodes in Example 5.

TABLE 2

Reverse voltage capability of Ti Schottky diodes fabricated on 4H—SiC with blanket ion milling termination. The ion species is Ar⁺. The ion beam current is 150 mA.

| Wafer No. | Ion Energy (eV) | Barrier (eV) | $V_R$ @ $J_R$ = 4 mAcm⁻² |
|---|---|---|---|
| EZ4 | 225 | 1.2 | 525 ± 25 |
| EZ3 | 335 | 1.2 | 597 ± 43 |
| EZ14 | 500 | 1.2 | 575 ± 25 |
| EZ13 | 750 | 1.2 | 525 ± 25 |

EXAMPLE 7

Schottky diodes with were fabricated on a highly n-doped SiC substrate GB9 with 4.8 μm SiC epitaxial layer lightly n-doped at a concentration of 9.3E15 cm⁻³. An ohmic contact was created on the highly doped side of the substrate by depositing a 2500 Å layer of Ni and annealing in vacuum. A 2500 Å layer of Re was deposited on the surface of the epilayer by rf magnetron sputtering. The current vs. voltage (IV) characteristics of the resulting diodes were measured. The wafer was then annealed in an Argon ambient at 800° C. for 30 minutes and the current vs. voltage characteristics measured again. The measured diode barrier and ideality factor are tabulated in Table 3. The IV characteristics have not degraded significantly after annealing at 800° C., demonstrating the ruggedness of the Re Schottky contact at temperatures up to 800° C.,

TABLE 3

Re Schottky diode forward characteristics before and after annealing at 800° C. in Ar for 30 min.

| | Ideality Factor (n) | Barrier Height (eV) |
|---|---|---|
| As Deposited | 1.06 | 1.19 |
| After 800° C. Anneal | 1.10 | 1.31 |

EXAMPLE 8

A highly n-doped SiC substrate GA3 was ion milled with Ar⁺ ions accelerated to 750 eV for 10 minutes at an ion beam current of 150 mA. The wafer was cross-sectioned using standard techniques and imaged using transmission electron microscopy. A damaged crystal structure was observed to extend 130 Å into the SiC surface where ion milled. The structure was damaged and not amorphous.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

REFERENCES

1. William F. Seng and Peter A. Barnes, *Mater. Sci. Eng. B, Vol.* 76 (2000) 226-231.
2. William F. Seng and Peter A. Barnes, *Mater. Sci. Eng. B, Vol.* 72 (2000) 13-18.
3. Ihsan Barin, "Thermochemical Data of Pure Substances, Parts I and II", VCH (1989).
4. J. S. Chen, E. Kolawa, M. -A. Nicolet, L. Baud, C. Jaussaud, R. Madar and C. Bernard, J. Appl. Phys., Vol. 75 (1994) 897-901.
5. T. Hatakeyama and T. Shinohe, *Mat. Sci. Forum Vols.* 389-393 (2002) 1169-1172
6. T. Hatakeyama, M. Kushibe, T. Watanabe, S. Imai and T. Shinohe, *Mat. Sci. Forum Vols.* 433-436 (2003) 831-834.

The invention claimed is:

1. A process for forming a SiC Schottky barrier diode comprising the steps of:
    providing a substrate of SiC with at least one surface having a highly doped layer of one conductivity type;
    forming an ohmic contact on said surface of said highly doped layer to provide one electrode of the diode;
    forming a lightly doped layer of SiC of the same one conductivity type on the other surface of said substrate to provide a drift region for the diode;
    forming a termination structure on the lightly doped layer of SiC by sputter-etching at least a portion of the surface of the lightly doped layer of SiC;
    forming a Schottky barrier contact on at least a portion of the termination structure of the lightly doped layer of SiC to provide the other electrode for the diode.

2. The method of claim 1 wherein the step of forming the Schottky barrier contact comprises depositing a layer of Re and masking and removing portions of the Re layer to provide a Schottky barrier contact that is greater than 250 Angstroms thick.

3. The method of claim 2 wherein the Re layer is between 2000 and 4000 Angstroms thick.

4. The method of claim 1 wherein the step of sputter etching is performed by ion milling.

5. The method of claim 4 wherein the step of ion milling comprises bombarding at least portions of the surface of the lightly doped layer with ions of one or more of the group consisting of argon, krypton, xenon and helium.

6. The method of claim 1 wherein step of forming the lightly doped layer comprises epitaxially depositing SiC to form said layer.

7. The method of claim 1 wherein silicon carbide is n-doped or p-doped and is 4H-SiC.

8. The method of claim 1 wherein silicon carbide is n-doped or doped and is 6H-SiC.

9. The method of claim 1 wherein silicon carbide is n-doped or p-doped and is 3C-SiC.

10. The process of claim 1 wherein the Schottky barrier contact comprises one or more metals or alloys of the group consisting of Re, Ti, W, and TiW.

11. The process of claim 1 wherein the Schottky barrier contact is formed only on at least a portion of the termination region.

12. A process for forming a SiC Schottky barrier device with a termination structure comprising the steps of:
    providing a substrate of SiC with at least one surface having a highly doped layer of one conductivity type;
    forming an ohmic contact on said surface of said highly doped layer to provide one electrode of the device;
    forming a lightly doped layer of SiC of the same one conductivity type on the other surface of said substrate to provide a drift region for the device;
    ion milling all of the surface of the lightly doped layer of SiC;
    forming a Schottky barrier contact on the lightly doped layer of SiC on at least a part of the ion milled portion of the surface of the lightly doped layer to provide another electrode for the device.

13. The process of claim 12 further comprising masking the surface of the lightly doped layer and removing a selected portion of the mask layer to expose a selected region of the surface of the lightly doped layer for ion milling.

14. The process of claim 13 wherein the selected region of the surface of the lightly doped layer surrounds the portion of the layer covered by the Schottky barrier contact.

15. The process of claim 12 wherein the Schottky contact material comprises one or more metals or alloys of the group consisting of Re, Ti, W, and TiW.

16. The method of claim 15 wherein the step of forming a Schottky barrier contact comprises depositing a Schottky barrier material to a thickness of at least 250 Angstroms.

17. The method of claim 16 wherein the thickness is between 2000 and 4000 Angstroms thick.

18. The method of claim 12 wherein the step of ion milling comprises bombarding all or a portion of the surface of the lightly doped layer with ions of argon or another noble gas.

19. The method of claim 12 wherein step of forming the lightly doped layer comprises epitaxially depositing SiC to form said layer.

20. The method of claim 12 wherein silicon carbide is n-doped or p-doped and is 4H-SiC.

21. The method of claim 12 wherein silicon carbide is n-doped or p-doped and is 6H-SiC.

22. The method of claim 12 wherein silicon carbide is n-doped or p-doped and is 3C-SiC.

23. The process of claim 12 wherein the Schottky barrier contact is formed only on at least a portion of the ion milled portion of the surface of the lightly doped layer.

* * * * *